United States Patent [19]

Nagashima

[11] Patent Number: 5,768,209
[45] Date of Patent: Jun. 16, 1998

[54] SEMICONDUCTOR MEMORY WITH NAND TYPE MEMORY CELLS HAVING NOR GATE OPERATION DELAY MEANS

[75] Inventor: Hirokazu Nagashima, Tokyo, Japan

[73] Assignee: NEC Corporation, Tokyo, Japan

[21] Appl. No.: 736,403

[22] Filed: Oct. 24, 1996

[30] Foreign Application Priority Data

Oct. 31, 1995 [JP] Japan .................................. 7-282940

[51] Int. Cl.$^6$ ........................................... G11C 8/00
[52] U.S. Cl. ................... 365/230.03; 365/230.06; 365/194; 365/189.08
[58] Field of Search ..................... 365/230.03, 230.06, 365/194, 104, 189.08

[56] References Cited

U.S. PATENT DOCUMENTS

| | | | |
|---|---|---|---|
| 5,400,279 | 3/1995 | Momodomi et al. | 365/185 |
| 5,402,375 | 3/1995 | Horiguchi et al. | 365/189.09 |
| 5,416,747 | 5/1995 | Ohira | 365/230.06 |
| 5,602,797 | 2/1997 | Kang | 365/230.06 |

*Primary Examiner*—David C. Nelms
*Assistant Examiner*—Hien Nguyen
*Attorney, Agent, or Firm*—Foley & Lardner

[57] ABSTRACT

A semiconductor memory with NAND type memory cells includes word drive circuits and selecting circuits. The word drive circuits receive first row selection signals for selecting memory cell blocks connected in series and second row selection signals for selecting given memory cells in the memory cell blocks. The selecting circuits receive the first row selection signals and control gates of memory cell block selection transistors connected in series with the memory cell blocks. Each of the word drive circuits includes a switching speed delaying circuit which causes a switching speed of selecting the memory cell blocks through the first row selection signals to be slower than a switching speed of selecting the given memory cells through the second row selection signals. The switching speed delaying circuit may be realized by inserting a resistor in a drain of each of the memory cell block selection transistors in the NOR gates. The changes of grounding inter-connection potential due to the discharge of inter-connection and gate capacitances are prevented from causing erroneous operation.

8 Claims, 3 Drawing Sheets

SEMICONDUCTOR MEMORY WITH NAND TYPE MEMORY CELLS HAVING NOR GATE OPERATION DELAY MEANS

BACKGROUND OF THE INVENTION

(1) Field of the Invention

The present invention relates to semiconductor memories, and more particularly to semiconductor memories using NAND type memory cells.

(2) Description of the Related Art

In the semiconductor memory of the kind to which the present invention relates, such as decoding methods for selecting NAND type memory cells, there are two methods by which non-selected word lines are brought to a high level. In one of these methods, all the word lines are normally held at the high level, and only a word line of a selected memory cell is switched to a low level. In the other method, the word lines are normally held at a low level, and only word lines of non-selected memory cells in a NAND type (vertically stacked) memory cell block to be selected are brought to the high level. The latter method is used mainly for minimizing stress generated in the memory cells. An example of a decoding circuit in the latter case will now be described with reference to FIG. 1.

Referring to FIG. 1, NMOS memory cells are represented by MC11 to MC1n and MC21 to MC2n, NMOS enhancement transistors for NAND type memory cell block selection by MS1 and MS2, inverters (INV) by 1 and 2, and NOR gates serving as word drive circuits by NOR31 to NOR3n and NOR41 to NOR4n. The NOR gates NOR31 to NOR3n and NOR41 to NOR4n each have a structure which is obtained by serially connecting NMOS transistors Q1 and Q2 connected in parallel and PMOS transistors Q3 and Q4 connected in series.

The NOR gates NOR31 to NOR3n and NOR41 to NOR4n allow selection of serially connected NAND type memory cell blocks (MC11 to MC1n, . . . , MC21 to MC2n) according to NAND type block selection signals XS1 to XSm. Given memory cells in the memory cell blocks are selected according to word selection signals XM1 to XMn and coupled through memory cell word lines (W10, W20). The memory cells MC11 to MC1n and MC21 to MC2n have their gates driven via the memory cell word lines (W10, W20).

The operations of this semiconductor memory when the memory cell MC21 is selectively switched over to the memory cell MC11 will now be considered.

The NAND type memory cell block selection signal XS1 and the word selection signals XM2 to XMn are inverted from the high level to the low level and coupled to the NOR gates NOR32 to NOR3n. As a result, the non-selected word lines of the selected NAND type memory cell block are brought to the high level. In this state, the word line selection signal XM1 is inverted from the low level to the high level. As a result, the output of the NOR gate NOR31 is brought to the low level, and the word line of the selected memory cell MC11 is brought to be low level. In this way, the memory cell MC11 is selected.

For the NAND type memory cell block which includes the memory cell MC21 to be made non-selected, the NAND type block selection signal XSm is brought to be the high level. As a result, the gates of all the memory cells MC21 to MC2n and the gate of the transistor MS2 are brought to the low level. In this way, the memory cell MC21 is made to be non-selected.

In this prior art semiconductor memory, a large number of memory cells are connected to each of the word lines W10, W20, . . . , and the inter-connection capacitances and memory cell gate capacitances are charged/discharged every time the word line is switched. Particularly, where NAND type memory cells are used, a plurality of non-selected memory cell word lines are simultaneously discharged when switching a NAND type memory cell block. This discharging causes a grounding inter-connection potential change, which in turn causes an erroneous operation of the internal circuit through the grounding inter-connection.

SUMMARY OF THE INVENTION

An object of the present invention is to overcome the problems existing in the prior art, and to provide a semiconductor memory which is free from erroneous operation due to grounding inter-connection potential changes.

According to one aspect of the invention, there is provided a semiconductor memory comprising:

a plurality of word drive circuits which receive a plurality of first row selection signals for selecting memory cell blocks connected in series and a plurality of second row selection signals for selecting given memory cells in the memory cell blocks and which respectively drive word lines of the given memory cells;

a plurality of memory cell block selection transistors whose gates are controlled and which are connected in series with the memory cell blocks; and an operation delaying means which is included in each of the word drive circuits and which causes a switching speed of selecting the memory cell blocks through the first row selection signals to be slower than a switching speed of selecting the given memory cells through the second row selection signals.

For the semiconductor memory according to the invention, the word drive circuits may be constituted by NOR gates for inputting first row selection signals, the NOR gates may be constituted by NMOS transistors connected in parallel and at least one PMOS transistor connected in series therewith, and the operation delaying means may be constituted by a circuit having a resistor inserted in the drain of the memory cell block selection transistor in each of the NOR gates.

In the semiconductor memory according to the invention, only the memory cell word line drive signal side operates slower by receiving the NAND type memory cell block selection signal. Thus, it is possible, without deteriorating the access speed, to prevent the occurrence of erroneous operation of internal circuits through the power supply and grounding inter-connections caused by potential changes of the power supply and grounding inter-connections which are due to the discharge of inter-connection capacitances and memory cell gate capacitances that occurs every time the word line is switched.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Figure 1:
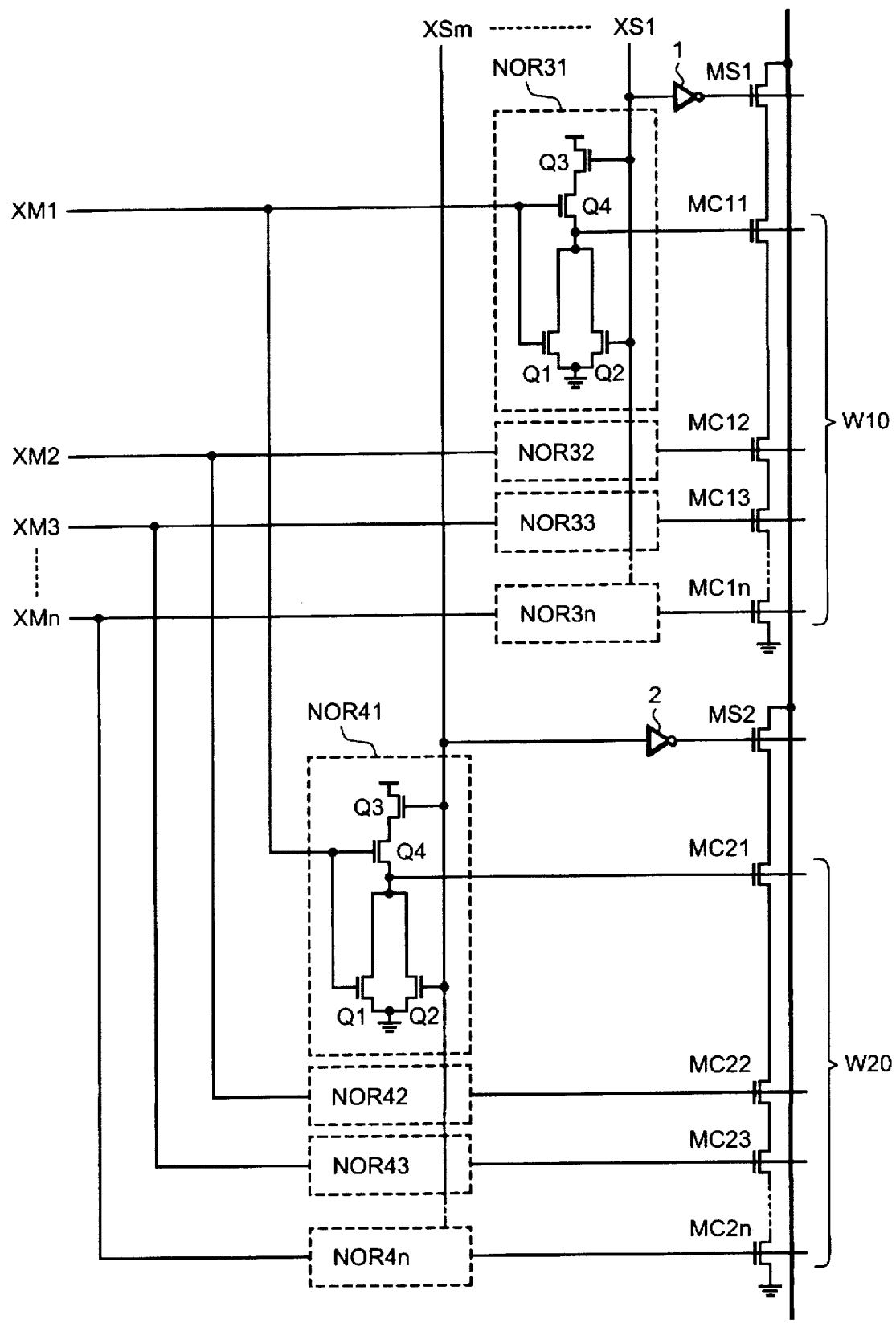
FIG. 1 is a circuit diagram for use in explaining an example of a prior art semiconductor memory.
Figure 2:
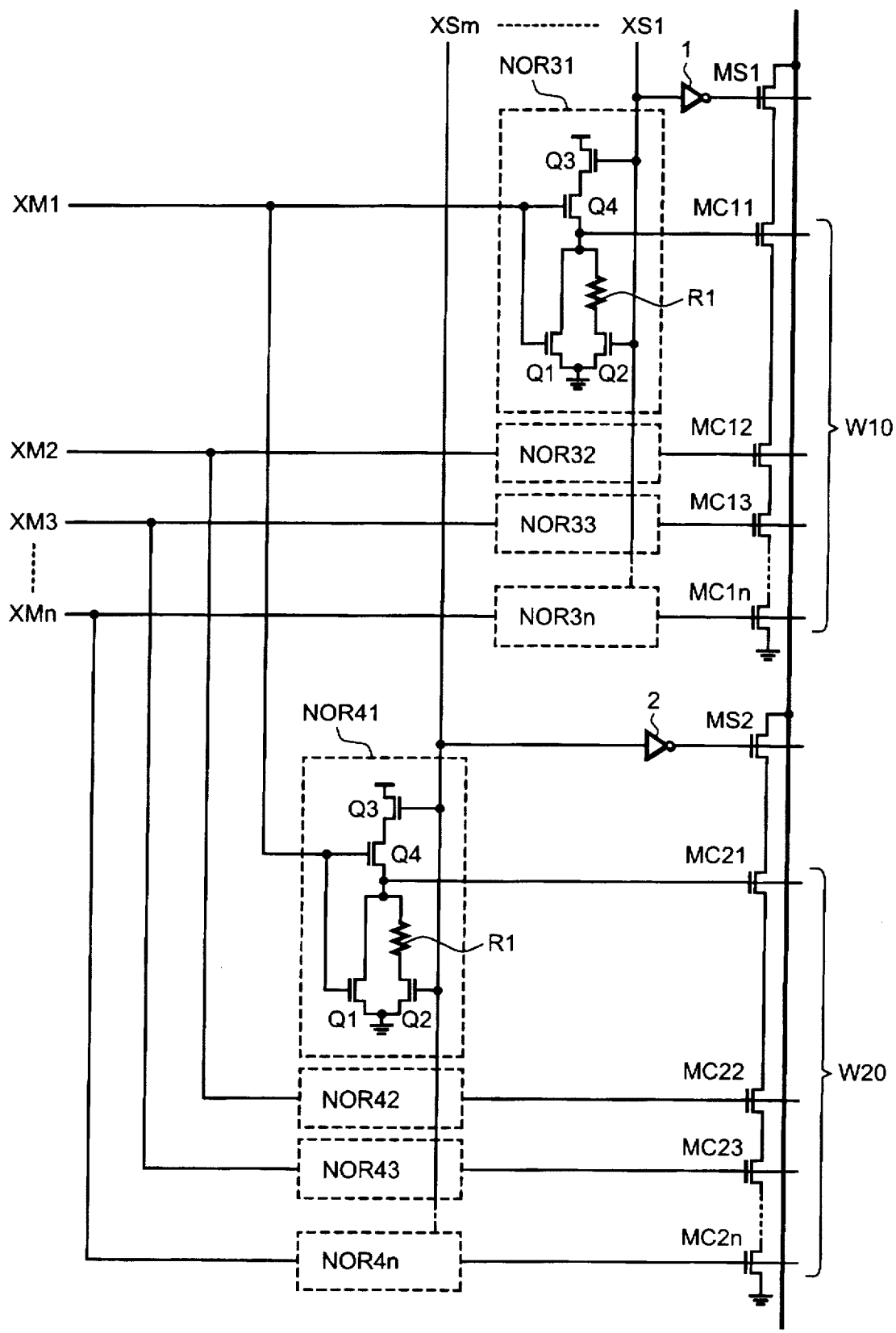
FIG. 2 is a circuit diagram for use in explaining a semiconductor memory of a first embodiment according to the invention.

FIG. 2 is a circuit diagram showing a semiconductor memory of a first embodiment according to the invention. In FIG. 2, as in FIG. 1, the illustrated semiconductor memory comprises NMOS memory cells MC11 to MC1n and MC21 to MC2n, NMOS enhancement transistors MS1 and MS2 for selecting a NAND type cell block, inverters 1 and 2, and NOR gates NOR31 to NOR3n and NOR41 to NOR4n serving as word drive circuits. In this embodiment, a difference from the prior art resides in the arrangement of the NOR gates NOR31 to NOR3n and NOR41 to NOR4n.

As in FIG. 1, each NOR gate has a structure obtained by serially connecting NMOS transistors Q1 and Q2 connected in parallel and PMOS transistors Q3 and Q4 connected in series. It is different, however, in that a resistor R1 is inserted only on the drain side of the NMOS transistor Q2 as a means for causing delays of the rise and fall of the NOR gate operation.

The NOR gates NOR31 to NOR3n and NOR41 to NOR4n are selected according to the word selection signals (i.e., second row selection signals) XM1 to XMn and NAND type memory cell block selection signals (i.e., first row selection signals) XS1 to XSm, and the selected NOR gates are connected via memory cell word lines W10, W20 to the gates of the corresponding ones of the memory cells MC11 to MC1n and MC21 to MC2n.

The operation of the semiconductor memory when the memory cell MC21 is switched over to the memory cell MC11 will now be described. The NAND type memory cell block selection signal XS1 and word selection signals XM2 to XMn are inverted from the high level to the low level and coupled to the NOR gates NOR31 to NOR3n. As a result, the non-selected word lines of the selected NAND type memory cell block are brought to the high level. In this state, the word line selection signal XM1 is inverted from the low level to the high level. As a result, the word line of the memory cell MC11 to be selected is brought to the low level, and thus the memory cell MC11 is selected.

For the NAND type memory cell block that includes the memory cell MC21 to be made non-selected, the NAND type memory cell block selection signal XSm is brought to the high level. As a result, the gates of all the memory cells MC21 to MC2n and the gate of the transistor MS2 are brought to the low level, and thus the memory cell MC21 is made to be non-selected.

The speed of the selective switching will now be considered. For the selection of the memory cell MC11, true data can be obtained when the word lines of all the non-selected ones of the memory cells MC12 to MC1n and the word line of the NAND type memory cell block selection transistor MS1 are both brought to the high level. For making the memory cell MC21 to be non-selected, it is only necessary that the gate of at least one NMOS enhancement transistor in the NAND type memory cell block that includes the memory cell MC21 is brought to the low level.

As shown in FIG. 2, in this embodiment, the signal for making the memory cell block to be non-selected is made sluggish with the insertion of the resistor R1 in the drains of each of the NMOS transistors Q2 which receive the block selection signals XS1 to XSm of the NOR gates NOR31 to NOR3n and NOR41 to NOR4n at their gates, thus prolonging the discharge current discharge time of the word line switching to suppress the grounding inter-connection potential change. Only the signal lines leading to the gates of the NAND type memory cell selection transistors are caused to be operated at a high speed by the inverters 1 and 2, and this operation determines the speed with which the memory cell blocks are made non-selected.

The grounding inter-connection potential change ΔV is $$\Delta V = L \cdot di/dt$$

where L is the parasitic inductance of the grounding inter-connection, and di/dt is the current change per unit time. The value of ΔV is thus proportional to the current change.

Considering an ideal condition free from the effects of parasitic capacitance elements in the case where, for instance, the "ON" resistance of the NMOS transistors Q1 and Q2 of the NOR gates NOR31 to NOR3n and NOR41 to NOR4n is 500 Ω and the resistance of the resistors R1 is 500 Ω, the peak current caused through the grounding inter-connection when an ideal pulse changing in 0 ns is inputted to the gates of the NMOS transistors Q1 and Q2, is reduced to one half as compared to the case where the resistors R1 are not employed, and thus the potential change ΔV is also reduced to one half.

As mentioned above, all the word lines of the non-selected memory cell blocks are brought to the low level in order to minimize the stress generated in the gate of the memory cell. This means that the stress generation time is suppressed to a minimum.

For example, in a semiconductor memory, in which 1 Kbits of memory cells are connected to one word line, the number of stages of the NAND type memory cells is 16 (i.e., n=16), and the number of the NAND type memory cells is 64, the total memory capacity is 1 Mbits. Even in this case, by permitting the memory cells to be used evenly, the time of stress generation in a given memory cell is 1/64 of that in a system in which all the word lines are held at the high level. By setting the speed of rising of the word lines of the non-selected NAND type memory cell blocks to double the operation rate, for instance setting the word line rising speed to 200 ns which is double the operation rate of 100 ns, the stress generation time is reduced only to 1/32, and the effect is sufficient for the alleviation of stress.

Figure 3:
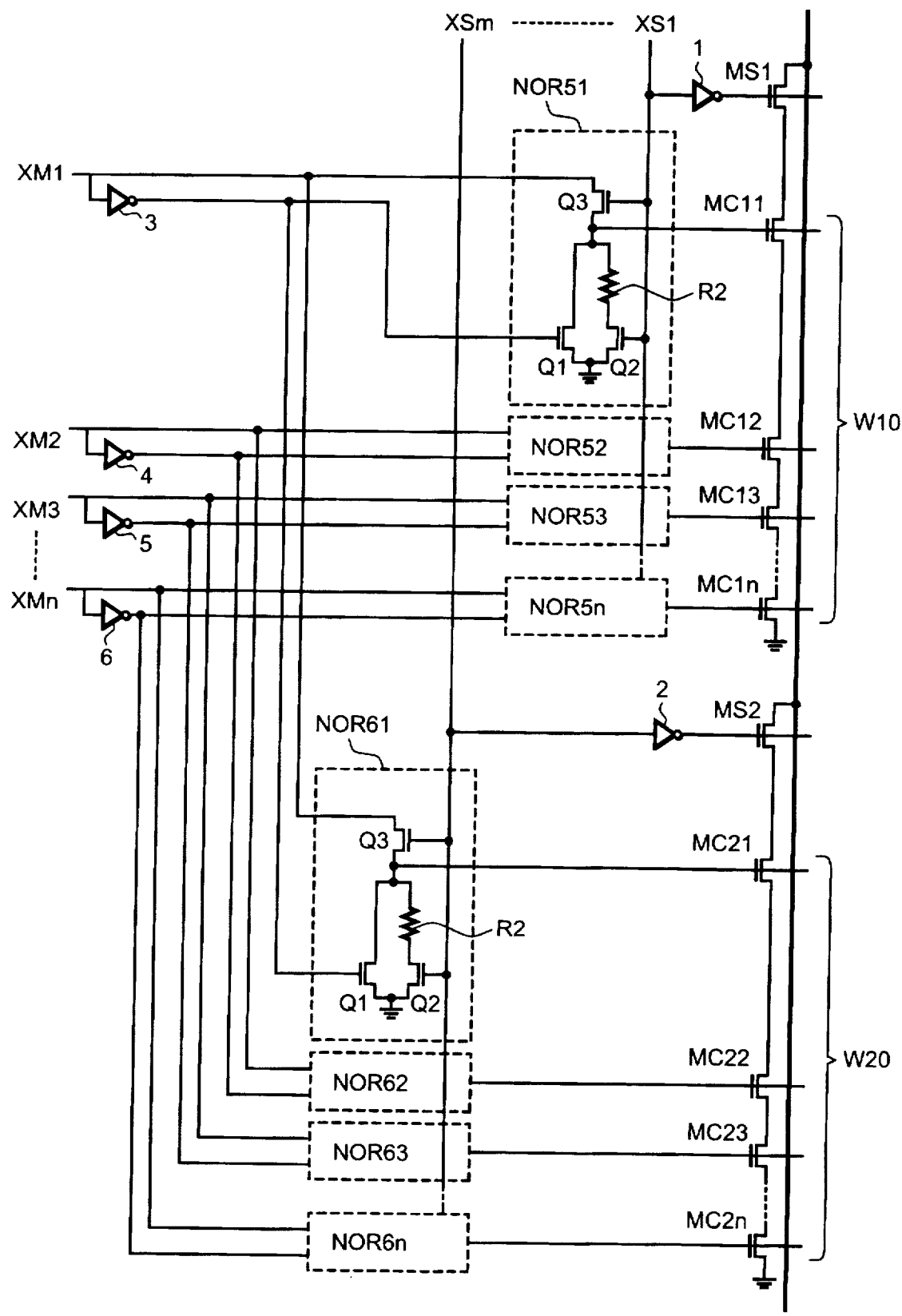
FIG. 3 is a circuit diagram for use in explaining a semiconductor memory of a second embodiment according to the invention.

FIG. 3 is a circuit diagram showing a second embodiment of the invention. In this circuit, instead of providing the NOR gates NOR31 to NOR3n and NOR41 to NOR4n in the case shown in FIG. 2, signals produced as a result of inversion of the word selection signals XM1 to XMn through inverters 3 to 6, are inputted together with the word selection signals XM1 to XMn. Specifically, NOR gates NOR51 to NOR5n and NOR61 to NOR6n of a different type are provided. In each of the NOR gates NOR51 to NOR5n and NOR61 to to NOR6n in the second embodiment, the PMOS transistor Q4 which is provided in each of the corresponding NOR gates of the first embodiment shown in FIG. 2 is omitted, and the word selection signals XM1 to XMn are connected to the NOR gates NOR51 to NOR5n and NOR61 to NOR6n in lieu of the power supply for the PMOS transistors Q3.

In this embodiment, the memory cell word lines W10 and W20 are driven by the NOR gates NOR51 to NOR5n and NOR61 to NOR6n, which are each constituted by the PMOS transistor Q3 and NMOS transistors Q1 and Q2. The signal for making the NAND type memory cell block to be non-selected, is made sluggish by inserting a resistor R2 in the drain of each of the NMOS transistors Q2 which receive the block selection signals XS1 to XSm from the NOR gates NOR51 to NOR5n and NOR61 to NOR6n to their gates, thus causing prolongation of the discharge current discharge time due to the word line switching. With this arrangement the grounding inter-connection potential changes are suppressed. Only the signal lines leading to the gates of the NAND type memory cell selection transistors are caused to be operated at a high speed by the inverters 1 and 2, and this operation determines the speed with which the memory cell blocks are made non-selected.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A semiconductor memory comprising:
   a plurality of word drive circuits which receive a plurality of first row selection signals for selecting memory cell blocks connected in series and a plurality of second row selection signals for selecting given memory cells in said memory cell blocks and which respectively drive word lines of said given memory cells, wherein each of said word drive circuits has first and second NMOS transistors connected in parallel and a third PMOS transistor connected in series with said first and second NMOS transistors;
   a plurality of memory cell block selection transistors whose gates are controlled by the plurality of said first row selection signals and which are connected in series with said memory cell blocks; and
   an operation delaying means connected in series to a drain of said second NMOS transistor and which causes a switching speed of selecting said given memory cells through said second row selection signals to be slower than a switching speed of selecting said memory cell blocks through said first row selection signals.

2. A semiconductor memory according to claim 1,
   wherein said first NMOS transistor has a gate receiving an inverted signal of said second row selection signal and a grounded source,
   wherein said second NMOS transistor has a gate receiving said first row selection signal and a grounded source; and
   wherein said third PMOS transistor has a gate receiving said first row selection signal, a source receiving said second row selection signal and a drain directly connected to a drain of said first NMOS transistor and also connected to a drain of said second NMOS transistor through said operation delaying means.

3. A semiconductor memory according to claim 1, further comprising:
   a fourth PMOS transistor connected between said third PMOS transistor and said first and second NMOS transistors connected in parallel,
   wherein said first NMOS transistor has a gate receiving said second row selection signal and a grounded source,
   wherein said second NMOS transistor has a gate receiving said first row selection signal and a grounded source;
   wherein said third PMOS transistor has a gate receiving said first row selection signal and a source connected to a power source; and
   wherein said fourth PMOS transistor has a gate receiving said second row selection signal, a source connected to a drain of said third PMOS transistor and a drain directly connected to a drain of said first NMOS transistor and also connected to a drain of said second NMOS transistor through said operation delaying means.

4. A semiconductor memory according to claim 1, wherein said operation delaying means comprises a resistor.

5. A semiconductor memory comprising:
   a plurality of memory cell blocks connected in series and each having a plurality of memory cells connected in series;
   a plurality of memory cell block selection transistors each connected in series with one of said memory cell blocks; and
   a plurality of word drive circuits each connected to one of said memory cells;
   a plurality of memory cell block selection signals each configured to select one of said memory cell blocks by activating said word drive circuits associated with said one of said memory cell blocks;
   a plurality of memory cell selection signals configured to select one of said memory cells in said one of said memory cell blocks by activating one of said word drive circuits associated with said one of said memory cell blocks and associated with said one of said memory cells; and
   a means for delaying the memory cell selection signals such that the memory cell block selection signals activate said word drive circuits first.

6. A semiconductor memory as in claim 5, wherein each of said plurality of word drive circuits includes first and second NMOS transistors connected in parallel and a third PMOS transistor connected in series with said first and second NMOS transistors, and
   wherein said means for delaying is connected in series between said second NMOS transistor and said third PMOS transistor.

7. A semiconductor memory as in claim 5, wherein each of said plurality of word drive circuits includes first and second NMOS transistors connected in parallel and third and fourth PMOS transistors connected in series with said first and second NMOS transistors, and
   wherein said means for delaying is connected in series between said second NMOS transistor and said fourth PMOS transistor.

8. A semiconductor memory as in claim 5, wherein said means for delaying comprises a resistor.

* * * * *